(12) United States Patent
Kanbe et al.

(10) Patent No.: US 8,008,108 B2
(45) Date of Patent: Aug. 30, 2011

(54) SOLID-STATE IMAGING DEVICE, METHOD OF PRODUCING THE SAME, AND CAMERA

(75) Inventors: Hideo Kanbe, Kanagawa (JP); Takayuki Ezaki, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/815,879

(22) Filed: Jun. 15, 2010

(65) Prior Publication Data
US 2011/0065225 A1    Mar. 17, 2011

Related U.S. Application Data

(63) Continuation of application No. 11/181,748, filed on Jul. 15, 2005, now Pat. No. 7,737,520.

(30) Foreign Application Priority Data

Aug. 10, 2004   (JP) ................................ P2004-233760

(51) Int. Cl.
*H01L 31/18* (2006.01)
(52) U.S. Cl. .................... 438/59; 257/E27.133
(58) Field of Classification Search .................. 257/184, 257/187, 203, 221, 291, 292, 293, 461, 462, 257/929, 447, E31.032, E31.127, E27.131, 257/E27.133; 348/294; 438/59
See application file for complete search history.

(56) References Cited

U.S. PATENT DOCUMENTS

| | | | |
|---|---|---|---|
| 4,040,092 A * | 8/1977 | Carnes ........................ | 348/249 |
| 4,656,519 A | 4/1987 | Savoye | |
| 5,311,530 A | 5/1994 | Wagner et al. | |
| 6,060,732 A * | 5/2000 | Murakami et al. ............ | 257/215 |
| 2003/0025160 A1 * | 2/2003 | Suzuki et al. ................. | 257/347 |

FOREIGN PATENT DOCUMENTS

| | | |
|---|---|---|
| JM | 04-343472 A | 11/1992 |
| JP | 04-154283 A | 5/1992 |
| JP | 07-211879 A | 8/1995 |
| JP | 08-241977 A | 9/1996 |
| JP | 10-150184 A | 6/1998 |
| JP | 2002-141940 A | 5/2002 |
| JP | 2002-151673 A | 5/2002 |
| JP | 2003-031785 A | 1/2003 |
| JP | 2003-051589 A | 2/2003 |

OTHER PUBLICATIONS

Japanese Office Action issued Jun. 16, 2009 for corresponding Japanese Application No. 2004-233760.

* cited by examiner

*Primary Examiner* — Evan Pert
*Assistant Examiner* — Selim Ahmed
(74) *Attorney, Agent, or Firm* — Rader, Fishman & Grauer PLLC

(57) ABSTRACT

To provide a solid-state imaging device able to improve light transmittance of a transparent insulation film in a light incident side of a substrate, suppress the dark current, and prevent a quantum efficiently loss, wherein a pixel circuit is formed in a first surface of the substrate and light is received from a second surface, and having: a light receiving unit formed in the substrate and for generating a signal charge corresponding to an amount of incidence light and storing it; a transparent first insulation film formed on the second surface; and a transparent second insulation film formed on the first insulation film and for retaining a charge having the same polarity as the signal charge in an interface of the first insulation film or in inside, thicknesses of the first and second insulation film being determined to obtain a transmittance higher than when using only the first insulation film.

6 Claims, 9 Drawing Sheets

FIG. 8

TRANSMITTANCE (%)    B: BLUE WAVELENGTH (450nm)    G: GREEN WAVELENGTH (540nm)

| THICKNESS OF SiO (nm) \ THICKNESS OF SiN (nm) | | 10 | 20 | 30 | 40 | 50 | 60 |
|---|---|---|---|---|---|---|---|
| 0 | B | 60.9 | 66.7 | 76.4 | 88.2 | 97.7 | 98.7 |
|   | G | 64.7 | 68.5 | 74.9 | 83.2 | 91.7 | 98.4 |
| 10 | B | 66.0 | 76.1 | 88.4 | 97.8 | 97.9 | 88.7 |
|    | G | 68.2 | 74.9 | 83.6 | 92.6 | 98.8 | 99.4 |
| 20 | B | 72.5 | 85.7 | 96.3 | 96.8 | 86.9 | 73.7 |
|    | G | 72.7 | 81.9 | 91.7 | 98.4 | 98.9 | 92.9 |
| 30 | B | 79.6 | 92.5 | 95.5 | 86.1 | 71.9 | 60.0 |
|    | G | 77.9 | 88.6 | 96.8 | 98.3 | 92.3 | 82.0 |
| 40 | B | 85.8 | 92.5 | 86.6 | 72.0 | 58.7 | 49.9 |
|    | G | 83.3 | 93.4 | 97.3 | 92.9 | 81.8 | 70.5 |
| 50 | B | 89.1 | 87.8 | 74.4 | 59.6 | 49.1 | 43.3 |
|    | G | 88.0 | 95.1 | 92.8 | 82.9 | 70.8 | 60.8 |

SiO₂: 15nm – 40nm    SiN: 20nm – 50nm

SOLID-STATE IMAGING DEVICE, METHOD OF PRODUCING THE SAME, AND CAMERA

CROSS REFERENCES TO RELATED APPLICATIONS

This application is a continuation of U.S. application Ser. No. 11/181,748, filed on Jul. 15, 2005, now U.S. Pat. No. 7,737,520 which claims priority to Japanese Patent Application No. JP 2004-233760 filed in the Japanese Patent Office on Aug. 10, 2004. The entire contents of these applications are incorporated herein by reference.

BACKGROUND OF THE INVENTION

1. Field of the Invention

The present invention relates to a back illumination type (back illuminated) solid-state imaging device receiving light from an opposite side to a surface formed with a pixel circuit, a method of producing the same, and a camera including the same.

2. Description of the Related Art

There is known, for example, front illumination type (front illuminated) solid-state imaging devices in which a light receiving unit and a read out transistor are placed with in a pixel, so, in a CCD type solid-state imaging device and a CMOS type solid-state imaging device, an area for the light receiving unit is restricted. For an enlargement of the area for the light receiving unit, in the CCD or CMOS type solid-state imaging device, an on-chip lens or a multilayered light receiving unit using photoconductive film has been employed. Also, in the CCD type solid-state imaging device, a frame transfer CCD using a transparent electrode or a thin polysilicon electrode has been employed.

In above configurations, an effective aperture area of the light receiving unit is enlarged to improve light sensitivity. As a pixel is smaller, an eclipse of incidence light is obviously by a pixel interconnection and a transfer gate electrode unit. Therefore, a back illuminated (back illumination type) solid-state imaging device has been expected as a configuration for high-sensitivity of the light receiving unit. As the back illuminated solid-state imaging device, a CCD type is discloses by Japanese Unexamined Patent Publication (Kokai) No. 2002-151673, and a MOS type is discloses by Japanese Unexamined Patent Publication (Kokai) No. 2003-31785. In the back illuminated solid-state imaging device, a frame transfer (FT) type or a frame interline transfer (FIT) type has been employed.

In the case of the CCD type and the MOS type, a p-type silicon substrate is used as a substrate. For example, Japanese Unexamined Patent Publication (Kokai) No. 6-350068 discloses the following three structures for suppressing a dark current at an interface of a back surface, namely a light incident surface.

A first structure is formed with a $p^+$-layer with high concentration at the back surface to suppress a depletion at the back surface. A second structure is formed with a transparence electrode via an insulation film at the back surface. A negative voltage is supplied to the transparent electrode to make a hole storage state in the back surface of a substrate. A third structure is injected with negative charges at an insulation film formed at the back surface of the substrate to make the hole storage state in the back surface of the substrate due to the negative charge.

SUMMARY OF THE INVENTION

In the above document, a silicon oxide film is formed as a reflection prevention film in a back surface of a substrate and p-type impurities are injected via the silicon oxide film by ion implantation. However, the silicon oxide film only has a transmittance of 75 to 80% in average. Namely, a light loss of 20 to 25% occurs to reduce the light sensitivity.

The present invention is to provide a solid-state imaging device able to improve light transmittance of a transparent insulation film at a light incident side of a substrate, suppress a dark current, and prevent a quantum efficiently loss, and a method of producing the same and a camera including the same.

According to an embodiment of the present invention, there is provided a solid-state imaging device in which a pixel circuit is formed in a first surface side of a substrate and light is received from a second surface side, the solid-state imaging device having: a light receiving unit formed in the substrate and for generating a signal charge corresponding to an amount of incidence light and storing the signal charge; a transparent first insulation film formed on the second surface of the substrate; and a transparent second insulation film formed on the first insulation film and for retaining a charge having the same polarity as the signal charge in an interface of the first insulation film or in inside. Thicknesses of the first insulation film and the second insulation film are determined to obtain a transmittance of the incidence light higher than when using only the first insulation film.

According to an embodiment of the present invention, there is provided a method of producing a solid-state imaging device having the steps of: forming a light receiving unit and a pixel circuit in a first surface side of a substrate; grinding a second surface side of the substrate to make the substrate thinner; forming a transparent first insulation film on the second surface of the substrate; forming a second insulation film on the first insulation film; and injecting charges having the same polarity as a signal charge in an interface between the first insulation film and the second insulation film or in the second insulation film. In the steps of forming the first insulation film and the second insulation film, the first insulation film and the second insulation film are formed to have thicknesses so as to obtain a transmittance of an incidence light higher than when using only the first insulation film.

According to an embodiment of the present invention, there is provided a method of producing a solid-state imaging device comprising the steps of: forming a light receiving unit and a pixel circuit at a first surface side of a substrate having a first insulation film; grinding a second surface side of the substrate to expose the first insulation film; forming a second insulation film on the first insulation film; and injecting charges having the same polarity as a signal charge in an interface between the first insulation film and the second insulation film or in the second insulation film. In the steps of forming the first insulation film and the second insulation film, the first insulation film and the second insulation film are formed to have thicknesses so as to obtain a transmittance of an incidence light higher than when using only the first insulation film.

According to an embodiment of the present invention, there is provided a camera having: a solid-state imaging device in which a pixel circuit is formed in a first surface side of a substrate and light is received from a second surface side; an optical system focusing light on the second surface of the solid-state imaging device; and a signal processing circuit performing a predetermined signal processing to an output signal from the solid-state imaging device. The solid-state imaging signal includes: a light receiving unit formed in the substrate and for generating a signal charge corresponding to an amount of incidence light and storing the signal charge; a transparent first insulation film formed on the second surface of the substrate; and a transparent second insulation film formed on the first insulation film, and for retaining a charge having the same polarity as the signal charge in an interface of the first insulation film or inside. The thicknesses of the first insulation film and the second insulation film are determined to obtain a transmittance of the incidence light higher than when using only the first insulation film.

According to a solid-state imaging device, a method of producing the same, and a camera of an embodiment of the present invention, it is able to improve light transmittance of a transparent insulation film at a light incident side of a substrate, suppress a dark current, and prevent a quantum efficiently loss.

BRIEF DESCRIPTION OF THE DRAWINGS

These features of embodiments of the present invention will be described in more detail with reference to the accompanying drawings, in which:

FIG. 8 is a view showing a transmittance of blue light and green light when employing various thicknesses of a silicon oxide and a silicon nitride.

DESCRIPTION OF THE PREFERRED EMBODIMENTS

Preferred embodiments of the present invention will be described with reference to the accompanying drawings. The present invention can be applied to a CCD type solid-state imaging device and a MOS type solid-state imaging device.

Figure 1:
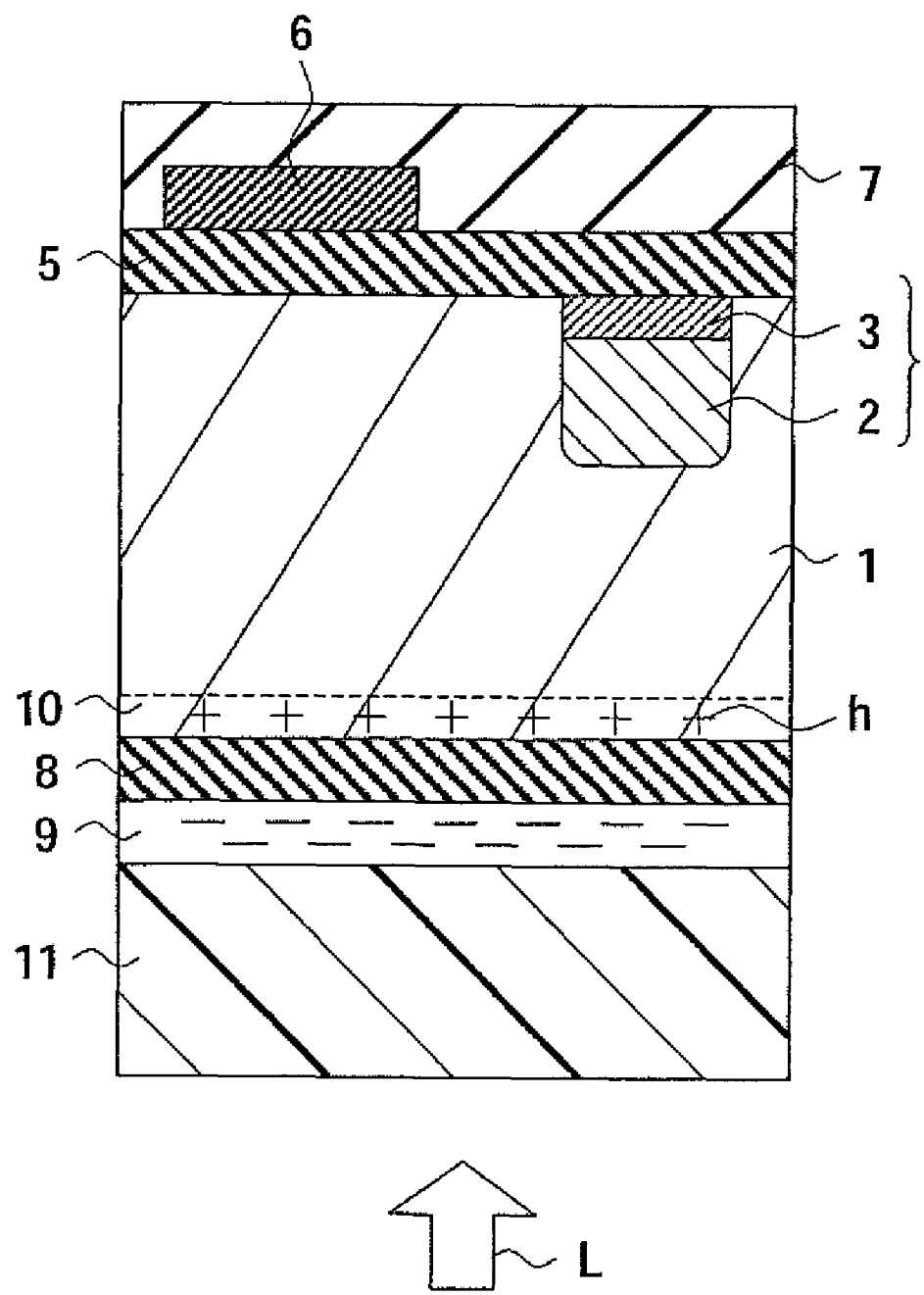
FIG. 1 is a cross-sectional view of a light receiving unit of a solid-state imaging device according to the present embodiment.

FIG. 1 is a view of an elementally portion in a light receiving unit of a solid-state imaging device according to the present embodiment.

In the present embodiment, a semiconductor substrate 1 of, for example, p-type silicon, is used. The thickness of the semiconductor substrate 1 depends on a kind and an application of the solid-state imaging device, and is preferably 4 to 6 μm for visible light or 6 to 10 μm for near-infrared radiation.

In the semiconductor substrate 1, an n-type semiconductor region 2 and a p-type semiconductor region 3 are formed in the respective pixels. The n-type semiconductor region 2 substantially stores signal charges converted from light in the semiconductor substrate 1.

The p-type semiconductor region 3 is formed at a first surface side (surface side) nearer than the n-type semiconductor region 2, and contains p-type impurities with higher concentration than the semiconductor substrate 1. The p-type semiconductor region 3 prevents a depleted layer generated between the n-type semiconductor region 2 and a p-type region around the n-type semiconductor region 2 from reaching a surface of the semiconductor substrate 1 to suppress a dark current and improve a quantum efficiency.

A light receiving unit 4 is a buried photo diode including the above n-type semiconductor region 2 and the p-type semiconductor region 3. The light receiving unit 4 stores a signal charge in the n-type semiconductor region 2 temporary.

On the first surface side of the semiconductor substrate 1, an electrode 6 included in a pixel circuit is formed via an insulation layer 5, for example, which is made of silicon. The electrode 6 is covered with an interlayer insulation layer 7, for example, which is made of silicon oxide.

In case of the CCD type solid-state imaging device, a CCD vertical transfer resistor is included in the pixel circuit. In this case, the electrode 6 corresponds to, for example, a transfer electrode of the CCD vertical transfer resistor, and a transfer channel of the n-type region is formed in the semiconductor substrate 1 beneath the electrode 6.

In case of the MOS type solid-state imaging device, a read out transistor, an amplifying transistor, a reset transistor, an address transistor, or other transistors are included in the pixel circuit. In this case, the electrode 6 corresponds to, for example, a gate electrode of various transistors, and source/drain regions of various transistors and a floating diffusion are formed in the semiconductor substrate 1.

Since the semiconductor substrate 1 is made thin at about 4 to 10 μm, a supporting substrate may be formed on the interlayer insulation film 7. In order to prevent an occurrence of a warp caused by a difference from a thermal expansion coefficient of the semiconductor substrate 1, as the supporting substrate, a silicon substrate which is the same as the semiconductor substrate 1 is used preferably.

At a second surface side (back surface) of the semiconductor substrate 1, a transparent first insulation film and a transparent second insulation film having a refractive index higher than the first insulation film are formed. In the present embodiment, a silicon oxide film 8 is formed as the first insulation film and a silicon nitride film 9 is formed as the second insulation film.

The thicknesses of the silicon oxide film 8 and the silicon nitride film 9 are adjusted to obtain a high transmittance to the incidence light due to a multiple interference effect of light in comparison with using only the silicon oxide film 8.

The thickness of the silicon oxide film 8 is 15 to 40 nm, and the thickness of the silicon nitride film 9 is 20 to 50 nm. In these ranges, the respective thicknesses are optimized to obtain the high transmittance to the incidence light in comparison with using only the silicon oxide film 8.

Charges which is the same polarity as the signal charge, for example, electrons in the present embodiment, are injected in the silicon nitride film 9 or in an interface between it and the silicon oxide 8. The reasons employing the silicon nitride film 9 are described as the followings. First, as employed to MONOS or other nonvolatile memory, the silicon nitride film has a good charge retention characteristic. Second, since the refractive index of the silicon nitride is higher than that of the silicon oxide film 8, by adjusting the thickness, a transmittance to the incidence light is obtained higher than only using the silicon oxide film 8 due to the multiple interference effect.

Since the electrons are stored in the silicon nitride 9, a hole storage layer 10 including a lot of holes h is generated in the vicinity of the interface between the semiconductor substrate 1 and the silicon oxide film 8 in the semiconductor substrate 1. Due to the hole storage layer 10, the occurrence of the dark current and the quantum effect loss are prevented as described below.

On the silicon nitride film 9, a protection film 11 is formed, which prevents the electrons stored in the silicon nitride film 9 from passing the outside to disappear. As the protection film 11, it is preferably materials with a low refractive index and low light absorption for visible light. Most of transparent resin films which are generally used for a semiconductor device can be used, and also a silicon oxide film formed by low temperature plasma CVD and a silicon oxide-nitride film formed by the similar way may be used.

Next, a method for producing a solid-state imaging device according to the present embodiment will be described with reference to FIGS. 2A and 2B, FIG. 3, and FIGS. 4A and 4B. In the present embodiment, an example producing the solid-state imaging device by using, for example, an SOI substrate will be described.

Figure 2A:
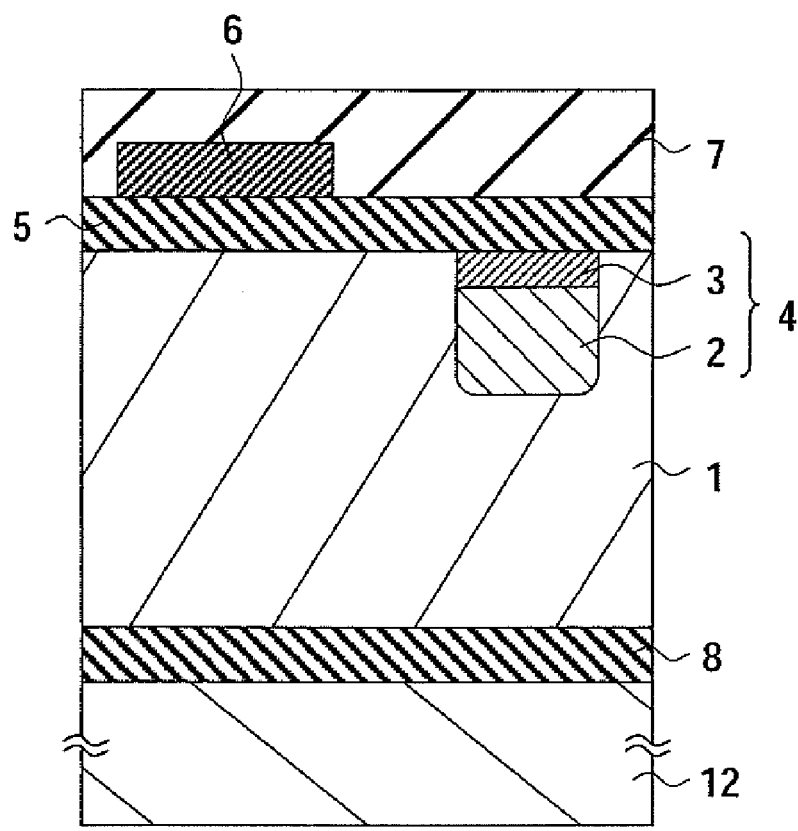
FIGS. 2A and 2B are cross-sectional views of a process for producing the solid-state imaging device according to the present embodiment.

First, as shown in FIG. 2A, an SOI substrate having the semiconductor substrate (SOI layer) 1 made of P-type silicon, the silicon oxide film 8, and the silicon substrate 12 are prepared. Here, the thickness of the silicon oxide film 8 is adjusted in 15 to 40 nm. Then, the light receiving unit and the pixel circuit are formed at the first surface (front surface) side of the semiconductor substrate 1 by a similar way to the related art.

Namely, the n-type semiconductor region 2, the p-type semiconductor region 3, and not shown various semiconductor regions are formed in the semiconductor substrate 1 of the SOI substrate by the ion implantation. Then, the insulation layer 5 made of a silicon oxide film is formed, further the electrode 6 is formed. The electrode 6 is made of tungsten or aluminum. After a formation of the electrode 6, silicon oxide is deposited to form the interlayer insulation film 7. If necessary, a not shown supporting substrate is bonded on the interlayer insulation film 7, and then the silicon substrate 12 is grinded and etched to expose the silicon oxide film 8.

Figure 2B:
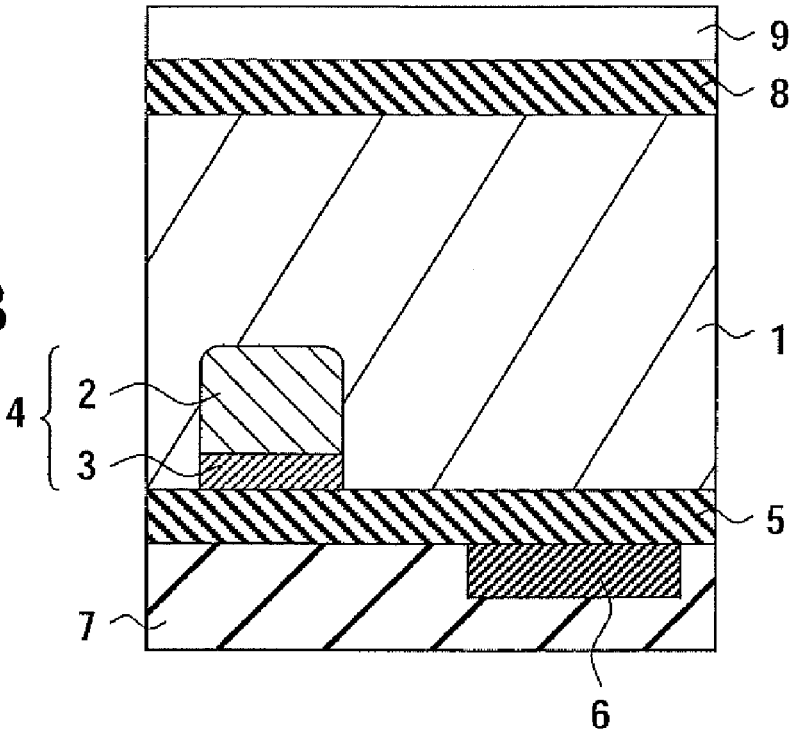

Then, as shown in FIG. 2B, the front and back of the semiconductor substrate 1 are reversed, and the silicon nitride film 9 is formed on the silicon oxide film 9 by plasma CVD. The thickness of the silicon nitride film 9 is selected in a range of 20 to 50 nm. Note that, if not using the SOI substrate, the semiconductor substrate 1 may be made thin, then the silicon oxide film 8 and the silicon nitride film 9 may be deposited successively.

Figure 3:
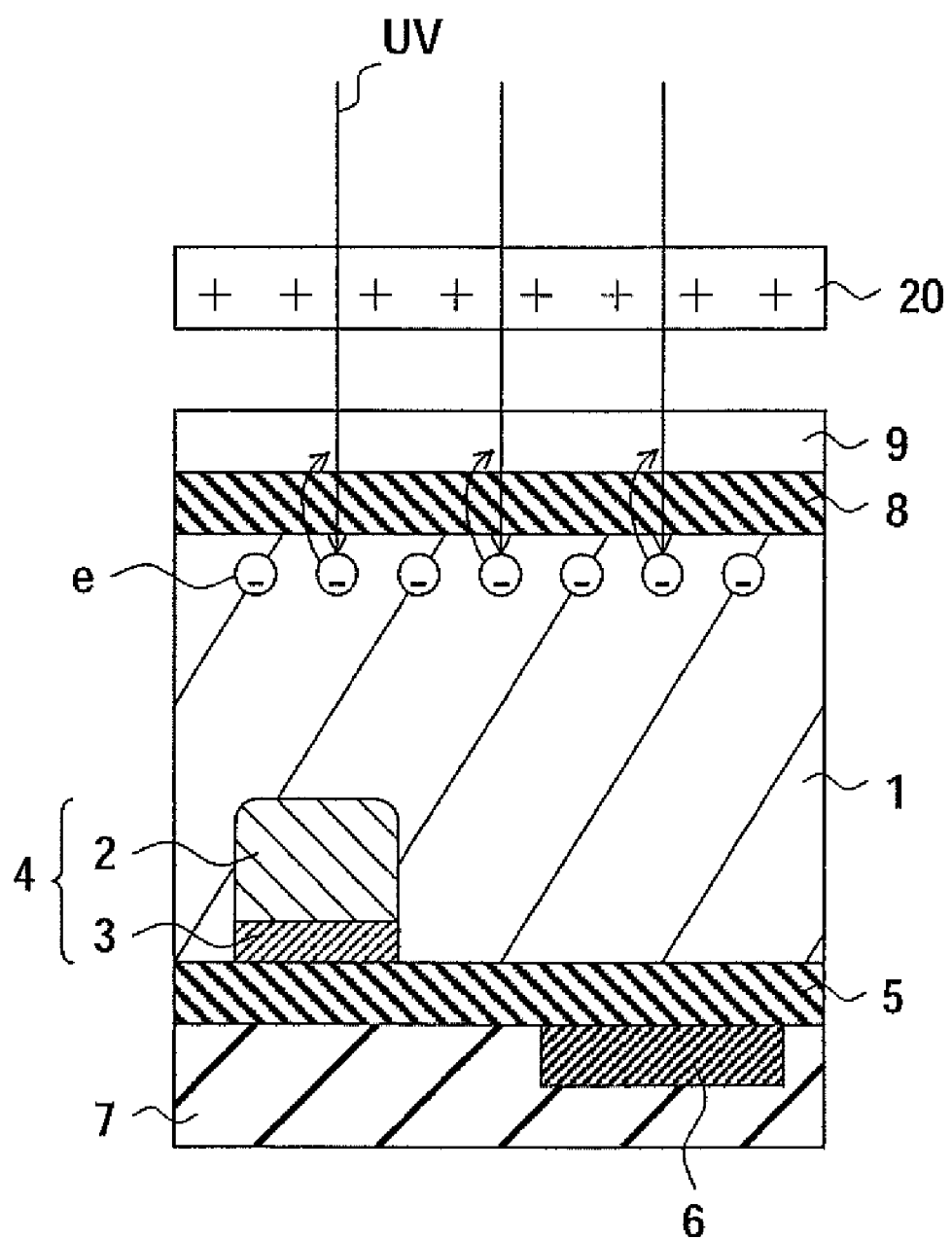
FIG. 3 is a cross-sectional view of a process for producing the solid-state imaging device according to the present embodiment.

Then, as shown in FIG. 3, for example, an electrode 20 charged to plus is opposed to the back surface (second surface) side of the semiconductor substrate 1, then ultraviolet rays are irradiated to the second surface side of the semiconductor substrate 1. By the ultraviolet rays, an electron e in the vicinity of the first surface of the semiconductor substrate 1 is excited. The excited electron e jumps over the silicon oxide film 8, and the excited electron e is trapped in the interface of the silicon oxide film 8 and the silicon nitride film 9, and in the silicon nitride film 9. Due to an electric field generated by the plus-charged electrode 20, the exited electron effectively jumps over the silicon oxide film 8. Note that, only irradiating of the incident light or supplying the silicon oxide film 8 with an electric field, the electrons can be injected in the interface between the silicon oxide film 8 and the silicon nitride film 9 or in the silicon nitride film 9.

Figure 4A:
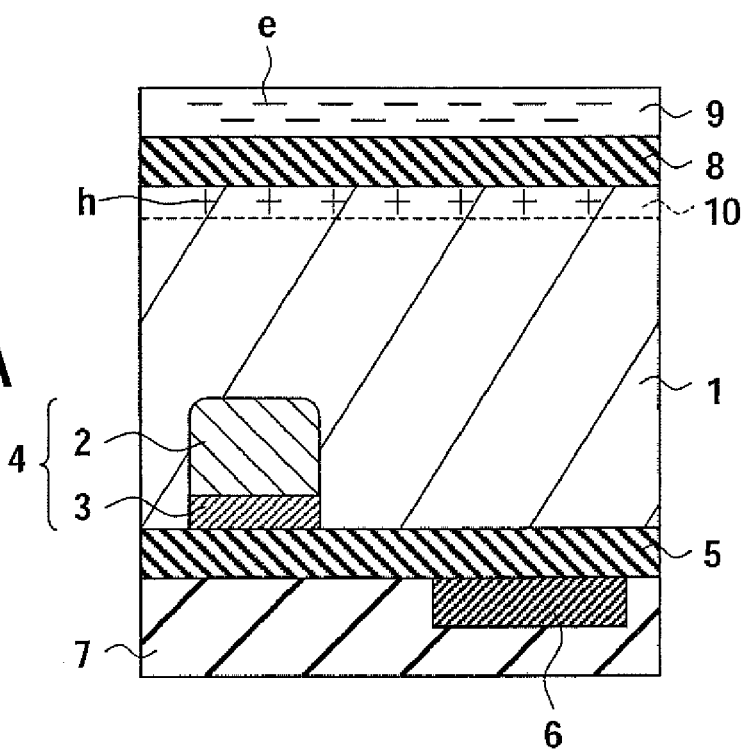
FIGS. 4A and 4B are cross-sectional views of a process for producing the solid-state imaging device according to the present embodiment.

As shown in FIG. 4A, the electrons are stored in the interface between the silicon oxide film 8 and the silicon nitride film 9 and in the silicon nitride film 9, consequently, in the semiconductor substrate 1 made of p-type silicon, the hole is concentrated in the vicinity of the interface of the silicon oxide film 8 to generate a hole storage layer 10.

Figure 4B:
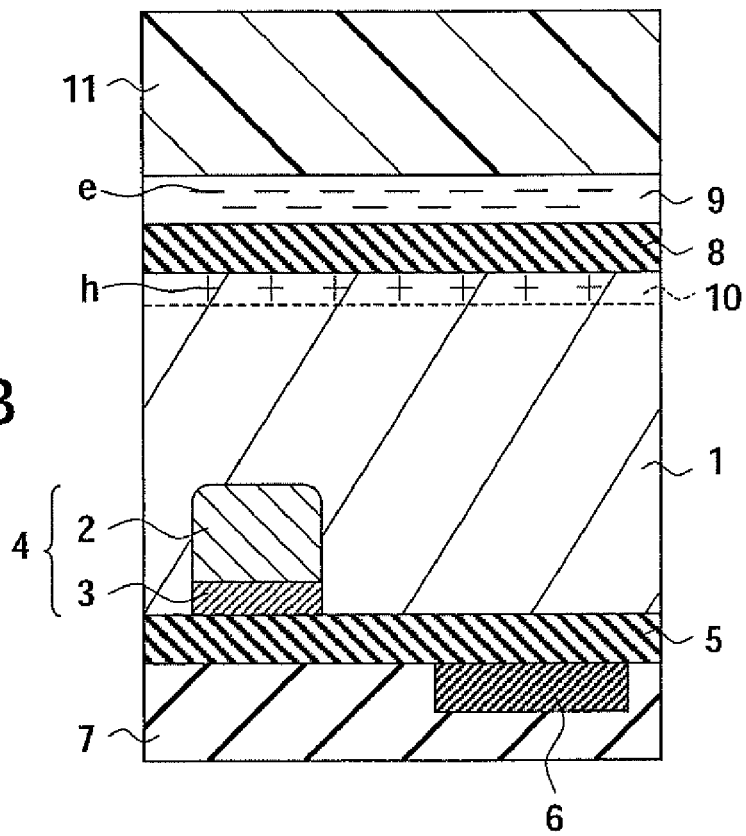

Then, as shown in FIG. 4B, the protection film 11 is formed on the silicon nitride film 9. As described above, in the formation of the protection film 11, for example, a coating of the transparent resin film, a deposition of the silicon oxide film by low temperature plasma CVD, or a deposition of the silicon oxide nitride film by low temperature plasma CVD is performed.

As the following steps, if necessary, a color filter is formed on the prevention film 11, and an on-chip lens is formed. Therefore, the solid-state imaging device is produced.

Next, an effect for preventions of the occurrence of the dark current and the quantum efficient loss will be described.

Comparative Example

Figure 5A:
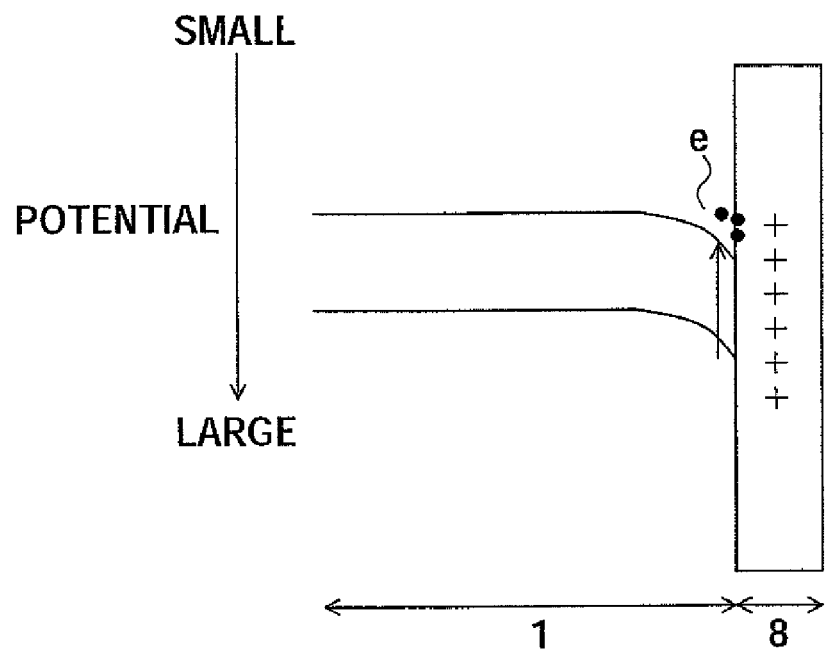
FIG. 5A is a view showing an energy band in the vicinity of a back surface of a semiconductor substrate of a comparative example.

FIG. 5A is a view showing an energy band in the vicinity of the back surface side of the semiconductor substrate 1 without the silicon nitride film 9. As shown in FIG. 5A, if silicon oxide is deposited on the semiconductor substrate 1, plus charges may be generated easily in the silicon oxide film 8 or in the interface between the semiconductor substrate 1 and the silicon oxide film 8. This applies to silicon oxide and other insulation films. As a result, a potential in the vicinity of the back surface of the semiconductor substrate 1 is raised to generate a potential-well. If the potential-well is formed in the vicinity of the back surface of the semiconductor substrate 1, electrons generated by a photoelectric conversion may be also stored in the vicinity of the back surface not to contribute the light sensitivity, and an occurrence of a minority carrier from the interface caused by heat may increase to raise the dark current, consequently an S/N ratio of the imaging device is reduced.

Therefore, the semiconductor substrate 1 is preferably has a structure in which the interface of the silicon oxide film 8 is filled with holes.

Figure 5B:
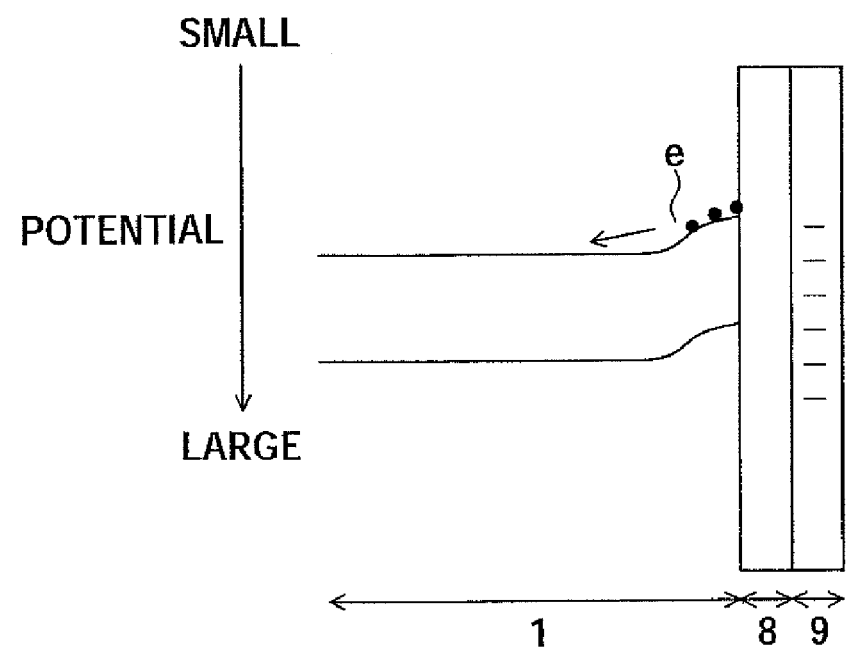
FIG. 5B is a view showing an energy band in the vicinity of a back surface of a semiconductor substrate of the present embodiment.

FIG. 5B is a view showing an energy band in the vicinity of the back surface (second surface) of the semiconductor substrate 1 in the solid-state imaging device according to the present embodiment. In the present embodiment, since the electrons are stored in the interface between the silicon oxide film 8 and the silicon nitride film 9 and in the silicon nitride film 9, the hole storage layer is generated at the interface of the back surface side of the semiconductor substrate 1. As a result, a potential in the interface of the back surface side of the semiconductor substrate 1 becomes reduced not to form the potential-well in the vicinity of the interface.

In this way, the potential-well (portion with high potential) is not formed in the interface of the back surface of the semiconductor substrate 1, so the electrons generated by the photoelectric conversion are stored effectively in the n-type semiconductor region 2 with the highest potential. The electrons stored in the n-type semiconductor region 2 can be entirely read out or drained, so that the occurrence of the dark current can be suppressed and the quantum efficiency can be improved.

Next, an effect which is obtained by improving the transmittance of visible light in the solid-state imaging device according to the present embodiment will be described.

Comparative Example

Figure 6A:
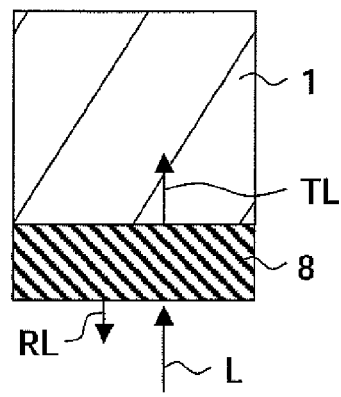
FIGS. 6A and 6B are views showing transmittance of a structure of the comparative example.
Figure 6B:
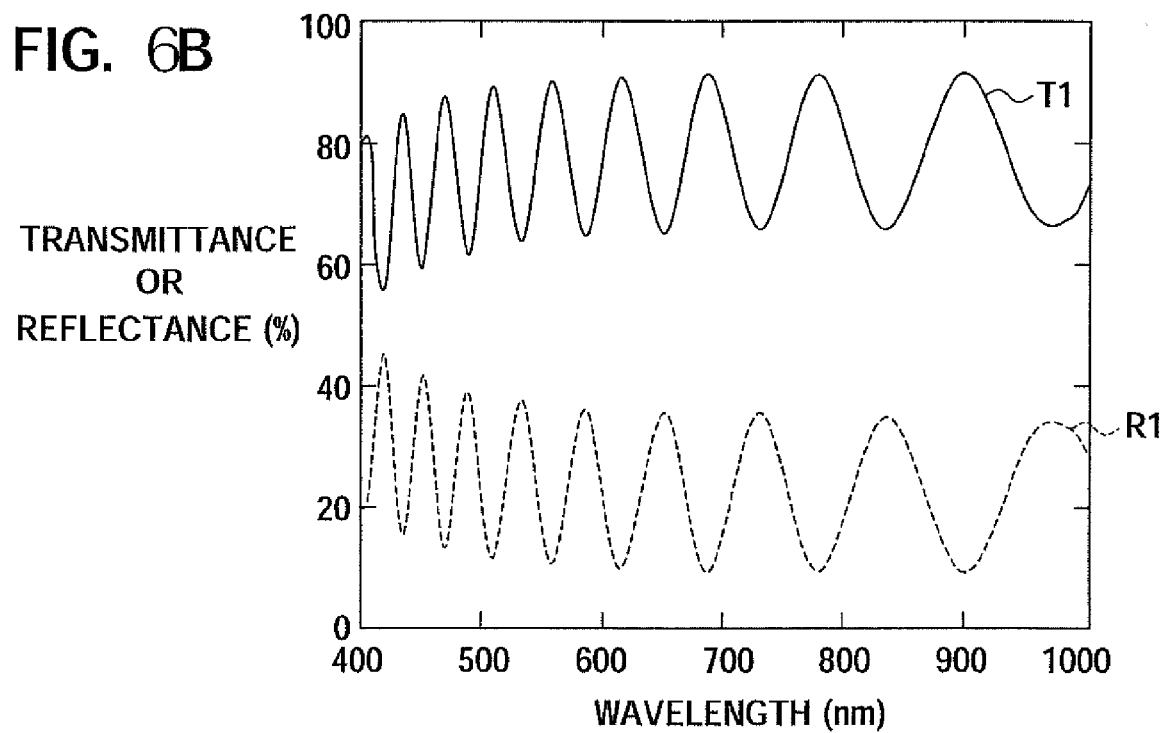

As shown in FIG. 6A, as a comparative example, only the silicon oxide film 8 having the thickness of 2 μm is formed at the second surface side of the semiconductor substrate 1. In a structure shown in FIG. 6A, a ratio (transmittance) of a transmitted light TL to an incidence light L and a ratio (reflectance) of a reflected light RL to the incidence light L are measured and the measured result will be shown in FIG. 6B. In FIG. 6B, "T1" is a graph indicating the transmittance and "R1" is a graph indicating the reflectance.

As shown in FIG. 6B, if only the silicon oxide film 8 is formed in the back surface (second surface) of the semiconductor substrate 1, the transmittance may be 75 to 80% in average in visible light, for example, 450 to 740 nm.

Figure 7A:
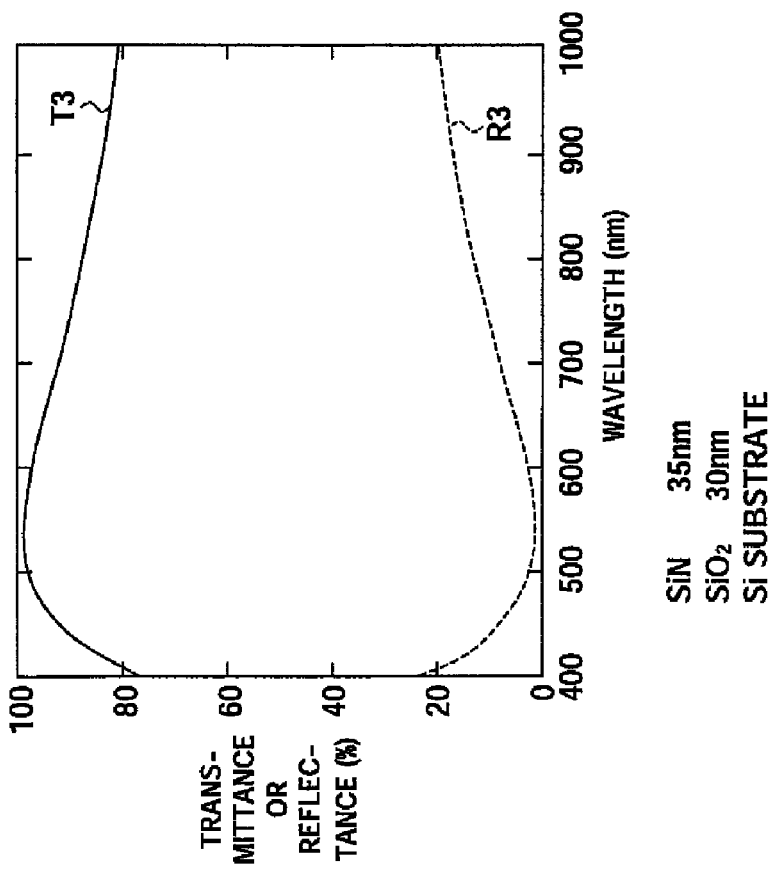
FIGS. 7A and 7B are views showing transmittance of a structure of the present embodiment.

FIG. 7A is a view of the measured result of the transmittance and the reflectance in the visible light when the silicon oxide film 8 having the thickness of 16 nm and the silicon nitride film 9 having the thickness of 40 nm are formed at the second surface side of the semiconductor substrate 1. In FIG. 7A, "T2" indicates the transmittance and "R2" indicates the reflectance.

Figure 7B:
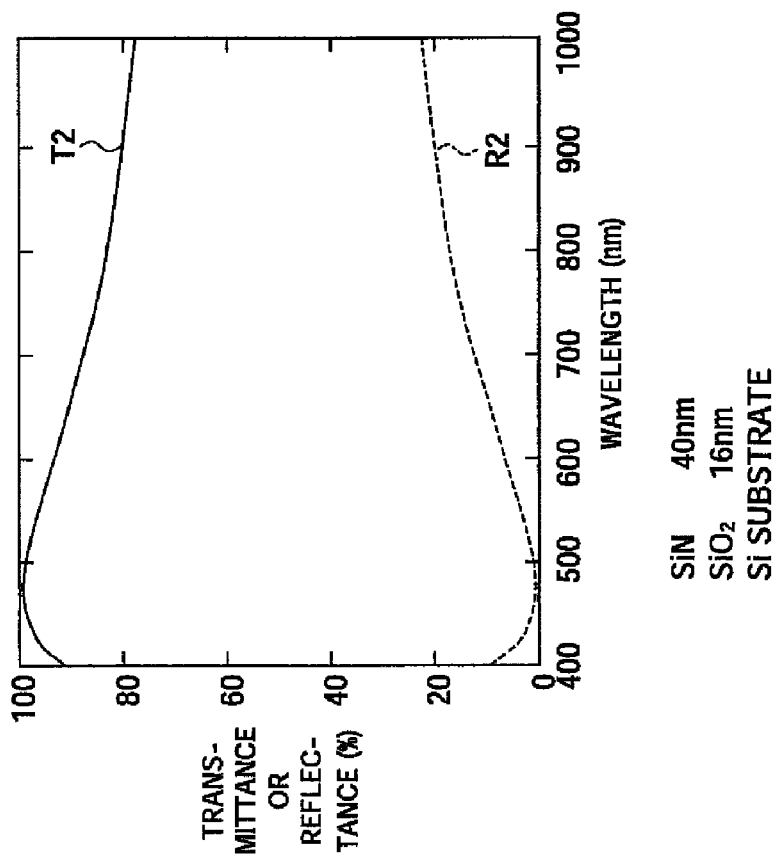

FIG. 7B is a view of a measured result of the transmittance and the reflectance in the visible light when the silicon oxide film 8 having the thickness of 30 nm and the silicon nitride film 9 having the thickness of 35 nm are formed in the second surface side of the semiconductor substrate 1. In FIG. 7B, "T3" indicates the transmittance and "R3" indicates the reflectance.

As shown in FIGS. 7A and 7B, a multilayer with the silicon oxide film 8 and the silicon nitride film 9 is formed in the second surface side of the semiconductor substrate 1, and the thicknesses of the both films are respectively adjusted. Consequently, due to the multiple interference effect of light, the transmittance higher than when only using the silicon oxide film 8 can be obtained. In examples shown in FIGS. 7A and 7B, the transmittance of 90 to 98% can be obtained in visible light.

By an adjustment of the thicknesses of the silicon oxide film 8 and the silicon nitride film 9, various transmittance characteristics can be obtained. For example, the solid-state imaging device is demanded to increase the light sensitivity of short wavelength side in visible light, namely, in a wavelength range from blue (450 nm) to green (540 nm). The examples shown in FIGS. 7A and 7B are one of examples of the suitable thickness for increasing the transmittance of such short wavelength side to improve the light sensitivity.

FIG. 8 is a view showing a measured result of the transmittance when forming the multilayer with the silicon oxide film 8 and the silicon nitride film 9 which have various thicknesses respectively. In FIG. 8, an ordinate indicates the thickness of the silicon oxide film 8 and an abscissa indicates the thickness of the silicon nitride film 9. In FIG. 8, considering an improvement of the light sensitivity in the short wavelength side, the transmittance (%) of blue light (450 nm) and green light (540 nm) are indicated in the respective thicknesses.

As shown in FIG. 8, by selecting the thickness of the silicon oxide film 8 in a range of 15 to 40 nm and the thickness of the silicon nitride film 9 in a range of 20 to 50 nm, the transmittance over 90% can be obtained in mostly case. Note that, in these ranges, a combination of the suitably thicknesses is selected.

If considering only the improvement of the transmittance, the thicknesses of the silicon oxide film 8 and the silicon nitride film 9 may be out of above ranges. However, in the present embodiment, the silicon oxide film 8 makes charges pass to the silicon nitride film 9, and the silicon nitride film 9 stores the charges.

Therefore, in terms of a passage of electrons, the silicon oxide film 8 is preferably no more than 40 nm. Further, depending on a relationship of the thickness of the silicon nitride film 9 to be used, in order to obtain a high transmittance, it is preferably no less than 15 nm (referred to FIG. 8).

Further, in order to effectively generate the hole storage layer 10 in the back surface of the semiconductor substrate 1, the silicon nitride film 9 preferably stores electrons in the vicinity of the interface of the silicon oxide film 8. Namely, if the thickness of the silicon nitride film 9 is too thick, a spatial distribution of the electrons to be stored may spread, so that the hole storage layer 10 is not able to effectively generate in the semiconductor substrate 1. Therefore, the thickness of the silicon nitride film 9 is preferably no more than 50 nm. Further, in order to obtain the high transmittance, the thickness of the silicon nitride film 9 is preferably no less than 20 nm (referred to FIG. 8).

As described above, according to the solid-state imaging device of the present embodiment, the hole storage layer 10 can be generated in the interface between the semiconductor substrate 1 and the silicon nitride film 8 to suppress the occurrence of the dark current to thereby improve the light sensitivity.

Similarity, by generating the hole storage layer 10, the quantum efficiency loss can be suppressed in the back surface of the semiconductor substrate 1, a color blend and a persistence of vision can be suppressed, and the high light sensitivity can be realized.

The silicon nitride film 9 is stacked on the silicon oxide film 8 and the both thicknesses are adjusted, so that due to the multiple interference effect of light, the transmittance of the visible light can be improved in comparison with using only the silicon oxide film 8 to improve the light sensitivity. For example, the transmittance over 90% can be secured in the vicinity of visible light, and the light sensitivity can be improved with 25% in comparison with using only the silicon oxide film 8.

The above solid-state imaging device can be used to, for example, a video camera, a digital steal camera, an electric endoscope camera or other camera.

Figure 9:
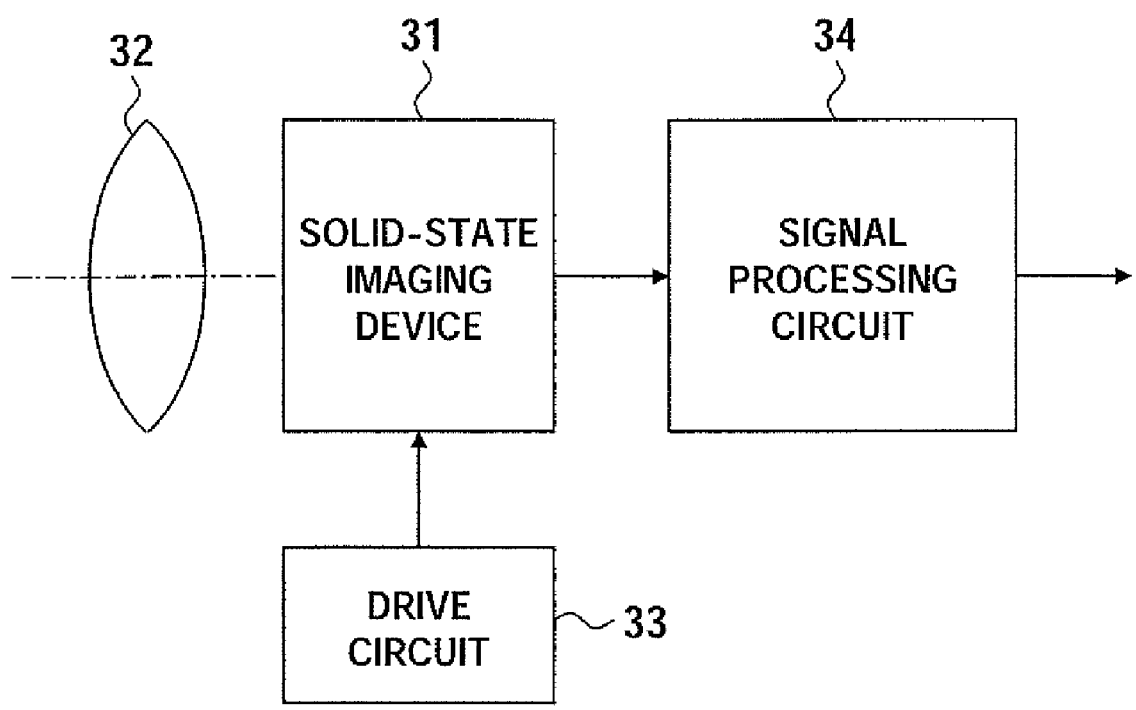
FIG. 9 is a view of a configuration of a camera according to the present embodiment.

FIG. 9 is a view of a configuration of a camera used with the above solid-state imaging device.

A camera 30 has the solid-state imaging device 31, an optical system 32, a drive circuit 33, and a signal processing circuit 34. The solid-state imaging device 31 is the back illuminated solid-state imaging device according to the present embodiment.

The optical system 32 makes imaging light from a subject, namely incidence light, focus on an imaging surface (second surface) of the solid-state imaging device 31. Consequently, in the respective light receiving unit 4 of the solid-state imaging device 31, the incidence light is converted to the signal charges corresponding to an amount of the incidence light. And in the n-type semiconductor region 2, the signal charge is stored for a predetermined period.

The drive circuit 33 supplies various drive signals to the solid-state imaging device 31. Consequently, the signal charges stored in the respective n-type semiconductor regions 2 of the solid-state imaging device 31 are read out. Further, by this drive, a signal is output from the solid-state imaging device 31.

The signal processing circuit 34 performs various signal processing to an output signal from the solid-state imaging device 31. After the signal processing by the signal processing circuit 34, the output signal is stored in a memory or other storage media.

In this way, by applying the solid-state imaging device described above to the camera 30 such as a video camera or a digital steal camera, it can be realized with the camera in which the light sensitivity can be improved, the dark current can be suppressed and the quantum efficiency can be improved. As a result, the camera improved with an image quality can be realized.

The present invention is not limited to the above embodiment.

If a hole is used as the signal charge, the hole may be stored in the interface between the silicon oxide film 8 and the silicon nitride film 9 and in the silicon nitride film 9 to generate the electron storage layer at the back surface of the semiconductor substrate 1. And, if the hole is used as the signal charge, polarities of various semiconductor regions may be reversed. Further, in the present embodiment, the example in which the silicon oxide film 8 is used as the first insulation film and the silicon nitride film 9 is used as the second insulation film is described, but other insulation films may be used and other impurities may be injected. If employing other insulation films, relatively, the second insulation film may have a refractive index higher than the first insulation film.

It should be understood by those skilled in the art that various modifications, combinations, sub-combinations and alterations may occur depending on design requirements and other factors in so far as they are within scope of the appeared claims or the equivalents thereof.

What is claimed is:

1. A method of producing a solid-state imaging device comprising the steps of:
    forming a light receiving unit and a pixel circuit in a first surface side of a substrate having a first insulation film;
    grinding a second surface side of said substrate to expose said first insulation film;
    forming a second insulation film on said first insulation film; and
    wherein a material of said first insulation film is different from a material of said second insulation film and a stacking structure of said first insulation film and said second insulation film has an effect of anti-reflection regarding to incident light.

2. A method of producing a solid-state imaging device as set forth in claim 1, after the step of forming said second insulation film, further comprising a step of forming a protection film on said second insulation film, said protection film preventing a charge from spreading to outside, and said charge being retained in an interface of said first insulation film and said second insulation film or in said second insulation film.

3. A method of producing a solid-state imaging device as set forth in claim 1, further comprising:
    injecting charges having the same polarity as a signal charge in an interface between said first insulation film and said second insulation film or in said second insulation film, wherein a charged electrode is opposed to said second surface side of said substrate.

4. A method of producing a solid-state imaging device as set forth in claim 1, further comprising:
    injecting charges having the same polarity as a signal charge in an interface between said first insulation film and said second insulation film or in said second insulation film, wherein light is irradiated to said second surface side of said substrate.

5. A method of producing a solid-state imaging device as set forth in claim 1, wherein forming said first insulation film comprises forming a silicon oxide film.

6. A method of producing a solid-state imaging device as set forth in claim 1, wherein forming said second insulation film comprising forming a silicon nitride film.

* * * * *